(12) United States Patent
Qi et al.

(10) Patent No.: US 10,355,104 B2
(45) Date of Patent: Jul. 16, 2019

(54) SINGLE-CURVATURE CAVITY FOR SEMICONDUCTOR EPITAXY

(71) Applicant: GLOBALFOUNDRIES Inc., Grand Cayman (KY)

(72) Inventors: Yi Qi, Niskayuna, NY (US); Sang Woo Lim, Ballston Spa, NY (US); Kyung-Bum Koo, Albany, NY (US); Alina Vinslava, Ballston Lake, NY (US); Pei Zhao, Clifton Park, NY (US); Zhenyu Hu, Clifton Park, NY (US); Hsien-Ching Lo, Clifton Park, NY (US); Joseph F. Shepard, Jr., Poughkeepsie, NY (US); Shesh Mani Pandey, Saratoga Springs, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/795,833

(22) Filed: Oct. 27, 2017

(65) Prior Publication Data

US 2019/0131432 A1     May 2, 2019

(51) Int. Cl.
*H01L 21/02*     (2006.01)
*H01L 21/84*     (2006.01)
(Continued)

(52) U.S. Cl.
CPC .. *H01L 29/66636* (2013.01); *H01L 21/02529* (2013.01); *H01L 21/02532* (2013.01); *H01L 21/3065* (2013.01); *H01L 21/845* (2013.01); *H01L 29/0847* (2013.01); *H01L 29/161* (2013.01); *H01L 29/165* (2013.01); *H01L 29/1608* (2013.01); *H01L 29/66795* (2013.01);
(Continued)

(58) Field of Classification Search
CPC ............. H01L 21/845; H01L 21/02529; H01L 21/02532; H01L 21/3065; H01L 27/0886; H01L 27/0924; H01L 29/66795
See application file for complete search history.

(56) References Cited

U.S. PATENT DOCUMENTS

| 6,881,635 B1 | 4/2005 | Chidambarrao et al. |
| 7,335,959 B2 | 2/2008 | Curello et al. |

(Continued)

OTHER PUBLICATIONS

George R. Mulfinger et al., "Shaped Cavity for Epitaxial Semiconductor Growth", U.S. Appl. No. 15/653,594, filed Jul. 19, 2017.

(Continued)

*Primary Examiner* — Phat X Cao
(74) *Attorney, Agent, or Firm* — Thompson Hine LLP; Francois Pagette

(57) ABSTRACT

Methods of forming a field-effect transistor and structures for a field-effect transistor. A gate structure is formed that overlaps with a channel region beneath a top surface of a semiconductor fin. The semiconductor fin is etched with an anisotropic etching process to form a cavity having a sidewall with a planar section extending vertically toward the top surface of the semiconductor fin and adjacent to the channel region in the semiconductor fin. The semiconductor fin is then etched with an isotropic etching process that widens the cavity at the top surface while preserving verticality of the planar section.

14 Claims, 2 Drawing Sheets

(51) Int. Cl.
*H01L 29/66* (2006.01)
*H01L 21/3065* (2006.01)
*H01L 29/78* (2006.01)
*H01L 29/161* (2006.01)
*H01L 29/16* (2006.01)
*H01L 29/165* (2006.01)
*H01L 29/08* (2006.01)

(52) U.S. Cl.
CPC ...... *H01L 29/7848* (2013.01); *H01L 29/7851* (2013.01)

(56) References Cited

U.S. PATENT DOCUMENTS

| | | |
|---|---|---|
| 8,138,053 B2 | 3/2012 | Utomo et al. |
| 8,410,539 B2 | 4/2013 | Mazoyer et al. |
| 8,796,759 B2 * | 8/2014 | Perng .................... H01L 29/165 |
| | | 257/328 |
| 8,803,206 B1 | 8/2014 | Or-Bach et al. |
| 9,640,531 B1 | 5/2017 | Or-Bach et al. |
| 2009/0315092 A1 * | 12/2009 | Mikasa .................... H01L 21/84 |
| | | 257/303 |
| 2011/0147842 A1 | 6/2011 | Cappallani et al. |
| 2012/0205716 A1 * | 8/2012 | Adam ............. H01L 21/823807 |
| | | 257/192 |
| 2012/0319166 A1 | 12/2012 | Adam et al. |
| 2015/0137193 A1 | 5/2015 | Cheng et al. |
| 2015/0228735 A1 | 8/2015 | Zhong et al. |
| 2017/0110579 A1 | 4/2017 | Chang et al. |
| 2017/0213821 A1 | 7/2017 | Or-Bach et al. |
| 2017/0250278 A1 * | 8/2017 | Tsai .................... H01L 29/7833 |
| 2017/0365690 A1 * | 12/2017 | Zhao .............. H01L 29/66545 |

OTHER PUBLICATIONS

USPTO, Office Action issued in U.S. Appl. No. 15/795,879.
USPTO, Final Office Action issued in U.S. Appl. No. 15/653,594 dated Jul. 27, 2018.
USPTO, Office Action issued in U.S. Appl. No. 15/653,594 dated Jan. 2, 2018.
Alina Vinslava et al., "Dual-Curvature Cavity for Epitaxial Semiconductor Growth", U.S. Appl. No. 15/795,879, filed Oct. 27, 2017.

* cited by examiner

SINGLE-CURVATURE CAVITY FOR SEMICONDUCTOR EPITAXY

BACKGROUND

The present invention relates to semiconductor device fabrication and integrated circuits and, more specifically, to structures for a field-effect transistor and methods of forming a field-effect transistor.

Device structures for a field-effect transistor generally include a source, a drain, and a gate structure configured to apply a control voltage that switches carrier flow in a channel formed in a body region. When a control voltage that exceeds a designated threshold voltage is applied, carrier flow occurs in the channel between the source and drain to produce a device output current.

A fin-type field-effect transistor (FinFET) is a non-planar device structure that may be more densely packed in an integrated circuit than planar field-effect transistors. A FinFET may include a fin, a source and a drain formed in sections of the fin, and a gate electrode that wraps about a channel located in the fin body between the source and the drain. The arrangement between the gate structure and fin body improves control over the channel and reduces the leakage current when the FinFET is in its 'Off' state in comparison with planar transistors. This, in turn, enables the use of lower threshold voltages than in planar transistors, and results in improved performance and lowered power consumption.

Epitaxial semiconductor films may be used to modify the performance of planar field-effect transistors and FinFETs. For example, an epitaxial semiconductor film can be used to increase the carrier mobility by inducing stresses in the channel. In a p-channel field-effect transistor, hole mobility can be enhanced by applying a compressive stress to the channel. The compressive stress may be applied by forming an epitaxial semiconductor material, such as silicon-germanium, at the opposite sides of the channel. Similarly, in an n-channel field-effect transistor, electron mobility can be enhanced by applying a tensile stress to the channel. The tensile stress may be applied by forming an epitaxial semiconductor material, such as silicon doped with carbon, at the opposite sides of the channel. These stressors may also operate as portions of source and drain regions of the field-effect transistor, and may function as a dopant supply for other portions of the source and drain regions.

The volume of the epitaxial semiconductor material contained in the stressors may be directly linked to device performance and yield. The stress imparted to the channel increases with increasing volume, which optimizes mobility. Increasing the volume may also reduce the source and drain resistance, and may also provide a consistent contact landing area in certain situations.

Accordingly, improved structures for a field-effect transistor and methods of forming a field-effect transistor are needed.

SUMMARY

In an embodiment of the invention, a method is provided for forming a field-effect transistor. The method includes forming a gate structure that overlaps with a channel region beneath a top surface of a semiconductor fin. The semiconductor fin is etched with an anisotropic etching process to form a cavity having a sidewall with a planar section extending vertically toward the top surface of the semiconductor fin and adjacent to the channel region in the semiconductor fin. The method further includes etching the semiconductor fin with an isotropic etching process that widens the cavity at the top surface while preserving verticality of the planar section.

In an embodiment of the invention, a device structure is provided for forming a field-effect transistor. The device structure includes a semiconductor fin with a channel region, a top surface, and a cavity adjacent to the channel region. The cavity includes a sidewall with a first section that is curved and a second section that extends vertically from the first section to the top surface. The second section of the sidewall is planar. The device structure further includes a gate structure that overlaps with the channel region, and an embedded source/drain region in the cavity.

BRIEF DESCRIPTION OF THE DRAWINGS

The accompanying drawings, which are incorporated in and constitute a part of this specification, illustrate various embodiments of the invention and, together with a general description given above and the detailed description given below, serve to explain the embodiments of the invention.

DETAILED DESCRIPTION

Figure 1:
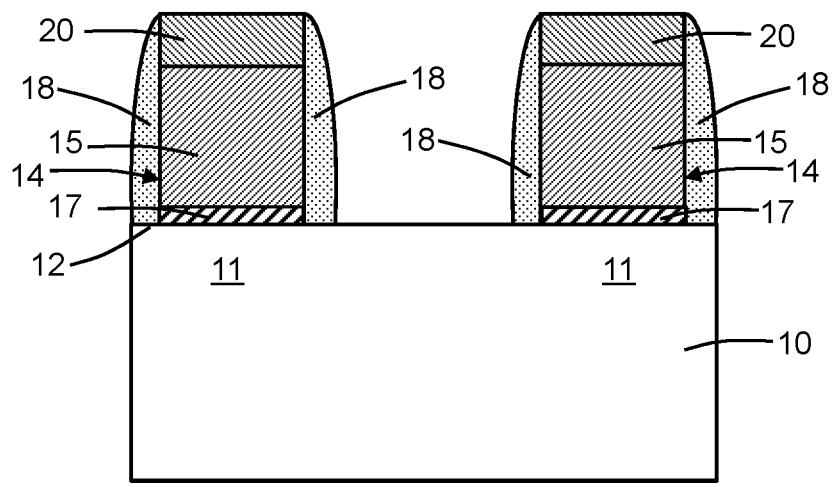
FIGS. 1-4 are cross-sectional views of a structure for a field-effect transistor at successive fabrication stages of a processing method in accordance with embodiments of the invention.

With reference to FIG. 1 and in accordance with embodiments of the invention, gate structures 14 are arranged on a top surface 12 of a semiconductor fin 10 and overlap with respective channel regions 11 in the semiconductor fin 10 at spaced apart locations. The semiconductor fin 10 is composed of a single crystal semiconductor material and, in an embodiment, the semiconductor fin 10 may be composed of single-crystal silicon. The semiconductor fin 10 may be formed by patterning a substrate or an epitaxial layer grown on a substrate using a sidewall imaging transfer (SIT) process, self-aligned double patterning (SADP), or self-aligned quadruple patterning (SAQP).

Each gate structure 14 includes a gate electrode 15 and a gate dielectric 17 disposed vertically between the gate electrode 15 and the semiconductor fin 10. The gate electrode 15 may be composed of polycrystalline silicon (i.e., polysilicon), or may include one or more barrier metal layers, work function metal layers, and/or fill metal layers composed of conductors, such as metals (e.g., tungsten (W)) and/or metal nitrides or carbides (e.g., titanium nitride (TiN) and titanium aluminum carbide (TiAlC)). The gate dielectric 17 may be composed of a dielectric material, such as silicon dioxide ($SiO_2$) or a high-k dielectric material like hafnium oxide ($HfO_2$). The gate structures 14 may be functional gate structures or, in the alternative, may be sacrificial gate structures that are subsequently removed and replaced by functional gate structures in a replacement metal gate process. The term "sacrificial gate structure" as used herein refers to a placeholder structure for a functional gate structure to be subsequently formed. The term "functional gate structure" as used herein refers to a permanent gate structure used to control output current (i.e., flow of carriers in the channel) of a field-effect transistor.

Sidewall spacers 18 are positioned on the top surface 12 of the semiconductor fin 10 at positions adjacent to the vertical sidewalls of each gate structure 14. The sidewall spacers 18 may be composed of a dielectric material, such as silicon nitride ($Si_3N_4$), deposited as a conformal layer by atomic layer deposition (ALD) and etched with a directional etching process, such as reactive ion etching (RIE). The conformal layer used to form the sidewall spacers 18 may be a protect layer that is applied over the semiconductor fin 10 and gate structures 14 while processing field-effect transistors of the complementary type.

The gate structures 14 and sidewall spacers 18 cover respective areas on the top and side surfaces of the semiconductor fin 10. The gate structures 14 may also be arranged to overlap with shallow trench isolation (not shown) surrounding the semiconductor fin 10. An area between the gate structures 14 and their sidewall spacers 18 on the top surface 10 and the side surfaces of the semiconductor fin 10 is exposed.

A cap 20 is arranged on the top surface of the gate electrode 15 of each gate structure 14 and in a space arranged laterally between the sidewall spacers 18. The caps 20 may be composed of a dielectric material, such as silicon nitride ($Si_3N_4$), deposited by chemical vapor deposition (CVD).

Figure 2:
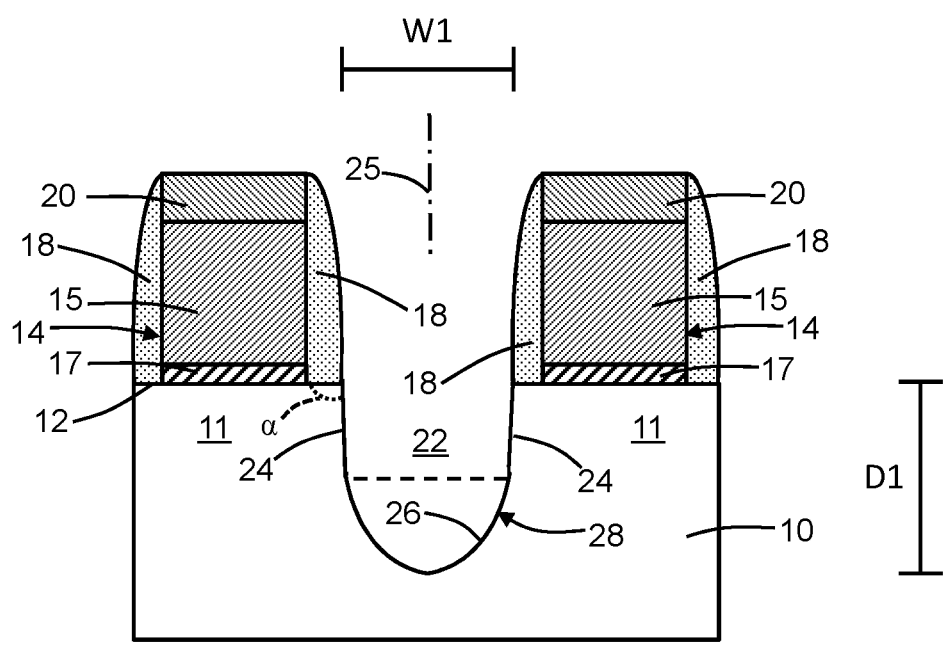

With reference to FIG. 2 in which like reference numerals refer to like features in FIG. 1 and at a subsequent fabrication stage of the processing method, a section of the semiconductor fin 10 arranged between the gate structures 14 and their sidewall spacers 18 is removed over the exposed area to form a trench or cavity 22 that penetrates in a vertical direction to a given depth into the semiconductor fin 10. The cavity 22 may be formed using an anisotropic etching process with a suitable etch chemistry. The etching process is directional (i.e., the etching process includes a vertical etching component and a negligible etching horizontal component) and is self-aligned by the sidewall spacers 18 cladding the gate structures 14.

In an embodiment in which the semiconductor fin 10 is silicon, the cavity 22 may be formed using a reactive ion etching (RIE) process and the reactive ions of the RIE process may be generated with a source gas including a mixture of hydrogen bromide (HBr) and chlorine ($Cl_2$). The RIE process may be performed with a higher wafer chuck bias voltage and at a lower chamber pressure (e.g., 7 millitorr) in the etch tool than used in anisotropic processes used to form conventional cavities. Such conventional cavity-forming anisotropic processes rely on a different source gas, such as a mixture of nitrogen triflouride ($NF_3$), argon (Ar), and helium (He), and are performed at a higher chamber pressure (e.g., 10 millitorr) in the etch tool and with a higher wafer chuck bias voltage.

The cavity 22 includes a sidewall 28 with sidewall sections 24 that are vertical (i.e., planar) and a sidewall section 26 with a given curvature (i.e., curved) that joins the sidewall sections 24. The sidewall sections 24 extend vertically over a portion of the height of the cavity 22. The separation between the sidewall sections 24 at the entrance to the cavity 22, which is located at the top surface 12 of the semiconductor fin 10, may have a width dimension, W1, equal to the distance between the sidewall spacers 18, which is result of the directionality of the etching process. Each of the sidewall sections 24 may intersect the top surface 12 of the semiconductor fin 10 at an angle, $\alpha$, that may be a right angle or within a few angular degrees of a right angle.

The sidewall section 26 is arranged between the sidewall section 24 on one side of the cavity 22 and the sidewall section 24 on the opposite side of the cavity 22. The sidewall sections 24 continuously and seamlessly merge with the sidewall section 26, as indicated diagrammatically by the dashed line. The sidewall section 26 has a concave shape directed upward toward the top surface 12 of the semiconductor fin 10 and may be centered symmetrically about the centerline 25 of the cavity 22. The sidewall section 26 curves inwardly from each of the sidewall sections 24 in a direction toward the deepest point (i.e., vertex) of the cavity 22, which is located at a depth, D1. The deepest point of the cavity 22 at depth, D1,may be arranged along the centerline 25 at a location at which the centerline 25 is projected to cross the profile of the sidewall section 26. The sidewall section 26 of the cavity 22 may be symmetrical about the centerline 25.

Figure 3:
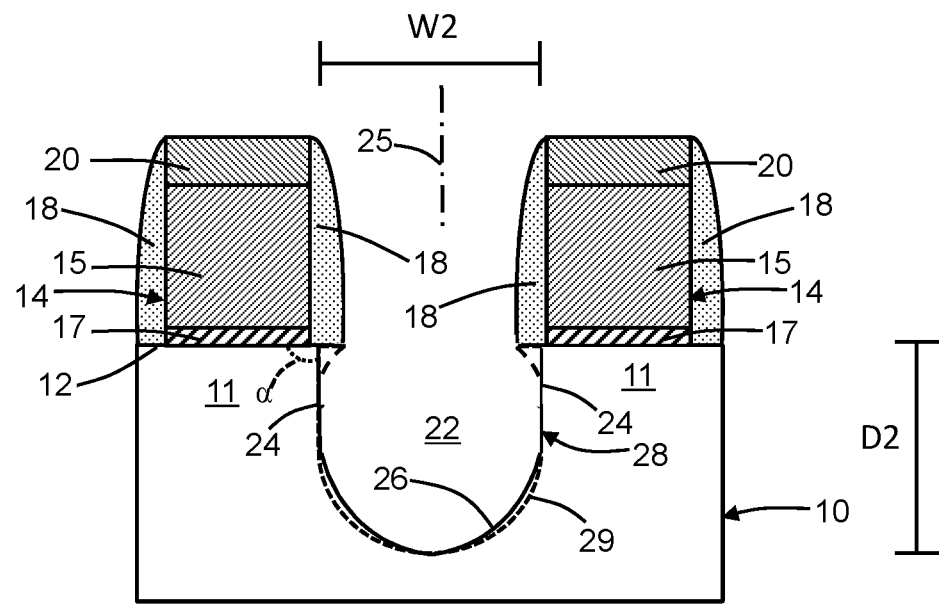

With reference to FIG. 3 in which like reference numerals refer to like features in FIG. 2 and at a subsequent fabrication stage of the processing method, the cavity 22 is expanded without changing its aspect ratio using a dry ion etching (RIE) process that is conformally isotropic in that the horizontal and vertical etch rates are approximately equal (i.e., the etching is uniform in all directions with equal vertical and lateral etching components). For example, the etching process may be a remote plasma-assisted dry etch process (e.g., a Frontier etch) using a downstream etcher that involves the simultaneous exposure of silicon of the semiconductor fin 10 to radicals (i.e., uncharged or neutral species) generated from a gas mixture of nitrogen triflouride ($NF_3$) and hydrogen ($H_2$). The etching process differs from an etching process, namely a reactive ion etching process using a gas mixture of chlorine, ammonia, and nitrogen with zero wafer chuck bias voltage to enhance the lateral etching component, that is used to form a conventional ball-shaped cavity 29, shown in dashed lines.

The cavity 22 is enlarged in volume (i.e., widened and deepened) without changing the shape of the sidewall 28 or the complementary profile of the sidewall of the semiconductor fin 10 at the sidewall 28. The sidewall sections 24 of the cavity 22 are displaced outwardly beneath the sidewall spacers 18 and continue to intersect the top surface 12 of the semiconductor fin 10 at a right angle (i.e., perpendicularly). The outward displacement causes the sidewall sections 24 to undercut the sidewall spacers 18, and increases the width, W2, between the sidewall sections 24 relative to the width, W1, after the anisotropic etching process (FIG. 2). Despite the outward displacement, the verticality of the sidewall sections 24 is maintained due to the uniform directionality of the conformal etching process. Each of the sidewall sections 24 remains planar and still vertically intersects the top surface 12 of the semiconductor fin 10 at an angle, $\alpha$, that may be a right angle or within a few angular degrees of a right angle. This vertical intersection contrasts with the conventional ball-shaped cavity 29 in which the sidewall curves inwardly toward the centerline 25 and intersects the top surface 12 at the end of an arc at an angle closer to the intersection of the curved edge of the sidewall spacer 18 with the top surface 12. The cavity 22 is widest at the top surface 12 of the semiconductor fin 10 where the sidewall sections 24 intersect the top surface 12, and the width of the cavity 22 narrows with increasing distance from the top surface 12 over the depth range of the sidewall section 26 such that the sidewall section 26 is narrower over all depths of the cavity 22 than the perpendicular distance between the sidewall sections 24.

The sidewall section 26 is deepened into the semiconductor fin 10 to have a depth, D2,that may be aligned between the sidewall sections 24 along the centerline 25. However, the sidewall section 26 maintains its initial curvature with an increase in the radius of curvature and an increase in the arc length as the sidewall section 26 is isotropically expanded outward by the etching of the semiconductor material of the semiconductor fin 10. The curvature of the sidewall section 26 is shallower than the curvature of the conventional ball-shaped cavity 29, which increases the separation between the sidewall section 26 and the channel regions 11 compared with the comparable section of the cavity 29. The sidewall sections 24, 26 provide a "shield" shape, in cross-section, in which the sidewall sections 24 define the linear edges of the shield shape and the sidewall section 26 provides the curved edge of the shield shape.

The sidewall of the semiconductor fin 10 adopts the shape of the sidewall sections 24, 26. A top section of the semiconductor fin 10, which is defined by the shape of the sidewall section 24, has a profile that is vertical and planar. Due to the verticality and position of the sidewall section 24, the top section of the semiconductor fin 10 is narrower at the top surface 12 of the semiconductor fin 10 than a top section of a fin with a profile defined by the conventional ball-shaped cavity 29. The narrowing of the top section of the semiconductor fin 10 may improve gate control in the device structure during operation.

A bottom section of the semiconductor fin 10 has a profile that is tapered to match the curved shape of the sidewall section 26. The top section of the semiconductor fin 10 near the top surface 12 will have a larger critical dimension than the bottom section of the semiconductor fin 10. The widening of the bottom section of the semiconductor fin 10 may improve leakage control in the device structure during operation compared with a top section of a fin with a profile defined by the conventional ball-shaped cavity 29.

Figure 4:
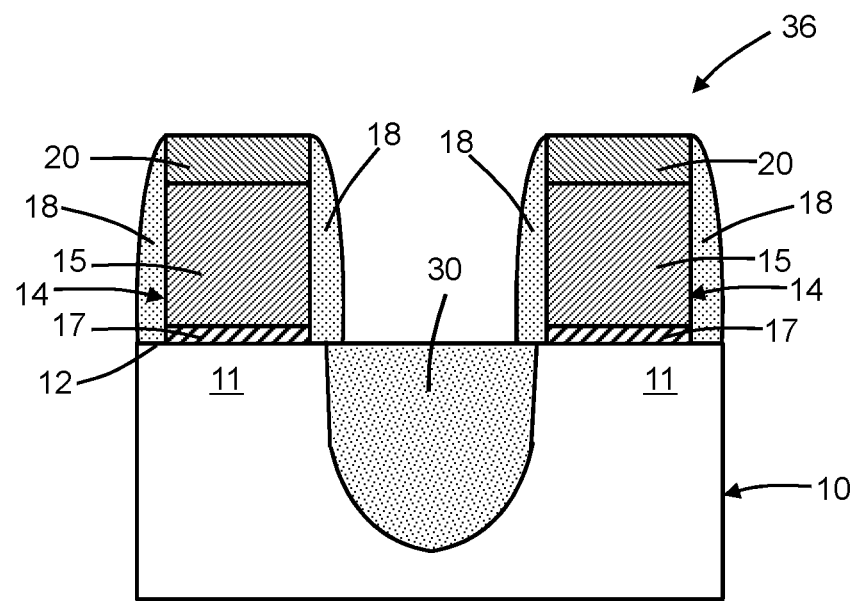

With reference to FIG. 4 in which like reference numerals refer to like features in FIG. 3 and at a subsequent fabrication stage of the processing method, an embedded source/drain region 30 is formed in the cavity 22 and may complete the formation of a multi-gate fin-type field-effect transistor (FinFET) 36. The embedded source/drain region 30 is comprised of epitaxial semiconductor material, such as silicon germanium (SiGe) or carbon-doped silicon (Si:C), that is grown in the cavity 22 and adopts the shape of the cavity 22 inside the fin 10, including the shape of the vertical sidewall sections 24 and the shape of the curved sidewall section 26.

The embedded source/drain region 30 may be grown by an epitaxial growth process that includes in situ doping during growth to impart a given conductivity type to the grown semiconductor material. In an embodiment, the embedded source/drain region 30 may be formed by a selective epitaxial growth process in which semiconductor material nucleates for epitaxial growth on semiconductor surfaces, but does not nucleate for epitaxial growth from insulator surfaces. As used herein, the term "source/drain region" means a doped region of semiconductor material that can function as either a source or a drain of a field-effect transistor. For a p-type field-effect transistor, the semiconductor material of the embedded source/drain region 30 may be doped with a p-type dopant selected from Group III of the Periodic Table (e.g., boron (B)) that provides p-type conductivity. For an n-type field-effect transistor, the semiconductor material of the embedded source/drain region 30 may be doped with an n-type dopant selected from Group V of the Periodic Table (e.g., phosphorus (P) or arsenic (As)) that provides n-type conductivity.

The embedded source/drain region 30 may be strained and incorporate internal stress through control over the conditions and parameters characterizing the epitaxial growth process. The embedded source/drain region 30 may operate as an embedded stressor that transfers stress to the channel regions 11 of the semiconductor fin 10 such that the channel regions 11 are placed under stain, which may increase carrier mobility during device operation. If the embedded source/drain region 30 is composed of Si:C, tensile strain may be produced in the channel regions 11, which may be appropriate for an n-type field-effect transistor. If the embedded source/drain region 30 is composed of SiGe, compressive strain may be produced in the channel regions 11, which may be appropriate for a p-type field-effect transistor.

The embedded source/drain region 30 has a higher proximity to (i.e., is closer to) the channel regions 11 in the upper section of the semiconductor fin 10 than the upper section of an embedded source/drain region formed in the conventional ball-shaped cavity 29 (FIG. 3). The higher proximity arises from the verticality and position of the upper section of the embedded source/drain region 30 adjacent to the sidewall section 24 and at the top surface 12 of the semiconductor fin 10. The sidewall section 24 and associated upper section of the embedded source/drain region lack the inward curvature of the sidewall of the conventional ball-shaped cavity 29 at the top surface of the fin. The reduced proximity of the sidewall section 26 and, therefore, the lower section of the embedded source/drain region 30 to the channel regions 11 may have an effect of improving drain-induced barrier lowering (DIBL).

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane. Terms such as "above" and "below" are used to indicate positioning of elements or structures relative to each other as opposed to relative elevation.

A feature "connected" or "coupled" to or with another element may be directly connected or coupled to the other element or, instead, one or more intervening elements may be present. A feature may be "directly connected" or "directly coupled" to another element if intervening elements are absent. A feature may be "indirectly connected" or "indirectly coupled" to another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for forming a field-effect transistor, the method comprising:
   forming a gate structure that overlaps with a channel region beneath a top surface of a semiconductor fin;
   etching the semiconductor fin with an anisotropic etching process to form a cavity having a sidewall with a curved section and a planar section arranged between the curved section and the top surface of the semiconductor fin, wherein the planar section is located adjacent to the channel region in the semiconductor fin; and
   etching the semiconductor fin with a conformally isotropic etching process having approximately equal horizontal and vertical etch rates that expands a volume of the cavity without changing an aspect ratio of the cavity and without changing a shape of the curved section and the planar section of the sidewall.

2. The method of claim 1 wherein the planar section intersects the top surface at a right angle.

3. The method of claim 1 further comprising:
   epitaxially growing an embedded source/drain region in the cavity.

4. The method of claim 3 wherein the embedded source/drain region includes internal stress that is transferred to the channel region in the semiconductor fin.

5. The method of claim 4 wherein the embedded source/drain region is composed of silicon-germanium, the field-effect transistor is a p-type field-effect transistor, and the embedded source/drain region transfers compressive strain to the channel region.

6. The method of claim 4 wherein the embedded source/drain region is composed of carbon-doped silicon, the field-effect transistor is an n-type field-effect transistor, and the embedded source/drain region transfers tensile strain to the channel region.

7. The method of claim 1 wherein the gate structure includes a gate electrode, and further comprising:
   forming a sidewall spacer adjacent to the gate electrode, wherein the planar section of the sidewall is arranged beneath the sidewall spacer.

8. The method of claim 7 wherein the anisotropic etching process is self-aligned by the sidewall spacer.

9. The method of claim 1 wherein the semiconductor fin is composed of silicon, and the anisotropic etching process is performed using a source gas containing a mixture of hydrogen bromide and chlorine.

10. The method of claim 1 wherein the semiconductor fin is composed of silicon, and the conformally isotropic etching process is performed using radicals generated from a first source gas containing a mixture of ammonia and hydrogen.

11. The method of claim 10 wherein the anisotropic etching process is performed using a second source gas containing a mixture of hydrogen bromide and chlorine.

12. The method of claim 1 wherein the planar section of the cavity is continuous with the curved section of the cavity following the conformally isotropic etching process.

13. The method of claim 1 wherein the cavity is isotropically expanded by the conformally isotropic etching process.

14. The method of claim 1 wherein the cavity has a shield shape following the conformally isotropic etching process.

* * * * *